United States Patent
Swanson

(10) Patent No.: US 6,392,806 B2
(45) Date of Patent: *May 21, 2002

(54) EFFICIENT ILLUMINATION SYSTEM FOR COLOR PROJECTION DISPLAYS

(75) Inventor: Gary J. Swanson, Lexington, MA (US)

(73) Assignee: Kopin Corporation, Taunton, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/038,197

(22) Filed: Mar. 10, 1998

Related U.S. Application Data

(63) Continuation of application No. 08/330,339, filed on Oct. 27, 1994, now abandoned.

(51) Int. Cl.[7] .......................... G02B 5/18; G02F 1/1335
(52) U.S. Cl. .................. 359/571; 359/569; 359/566; 359/900; 349/61; 349/104
(58) Field of Search ................ 359/567, 566, 359/568, 569, 571, 558, 900; 349/61, 62, 104

(56) References Cited

U.S. PATENT DOCUMENTS

| | | | |
|---|---|---|---|
| 4,105,289 A | * 8/1978 | Hershel ...................... 359/563 |
| 4,649,351 A | * 3/1987 | Veldkamp et al. ........... 359/349 |
| 4,798,448 A | * 1/1989 | Van Raalte ................... 349/62 |
| 4,846,552 A | * 7/1989 | Veldkamp et al. ........... 359/572 |
| 4,895,790 A | * 1/1990 | Swanson et al. ............. 430/321 |
| 4,933,649 A | * 6/1990 | Swanson et al. ............. 359/349 |
| 5,027,359 A | * 6/1991 | Leger et al. ................... 372/18 |
| 5,033,060 A | * 7/1991 | Leger et al. ................... 372/97 |
| 5,089,023 A | * 2/1992 | Swason ........................... 623/6 |
| 5,124,843 A | * 6/1992 | Leger et al. ................. 359/565 |
| 5,161,042 A | * 11/1992 | Hamada ....................... 349/62 |

(List continued on next page.)

FOREIGN PATENT DOCUMENTS

| EP | 0421855 A1 | * | 4/1991 |
| EP | 0583150 A1 | * | 2/1994 |
| GB | 2152724 A | * | 8/1985 |
| JP | SHO 60-165623 | * | 8/1985 |
| JP | SHO 60-165624 | * | 8/1985 |

(List continued on next page.)

OTHER PUBLICATIONS

G. J. Swanson, et al., "Aperture Filling of Phase–Locked Laser Arrays" Optical Society of America., Apr. 1987.*
H. Dammann, "Color Separation Gratings", Applied Optics, vol. 17, No. 15, pp. 2273–2275, Aug. 1978.*

(List continued on next page.)

Primary Examiner—Cassandra Spyrou
Assistant Examiner—John Juba, Jr.
(74) Attorney, Agent, or Firm—Hamilton, Brook, Smith & Reynolds, P.C.

(57) ABSTRACT

A method and system for providing an improved color image wherein a broad spectrum light is supplied to a phase grating which provides dispersed light having multiple diffraction orders. The dispersed light is supplied to a zero-order phase shifter which shifts the phase of the undiffracted (zero order) light relative to the diffracted light. The light from the phase shifter is thereupon concentrated so that the plane of the phase grating is imaged onto a display having a plurality of pixels assigned to transmit different spectral regions. The depths of the grating elements of each of the grating periods of the phase grating and the depth of the zero-order phase element of the phase shifter are selected to maximize the area of chromaticity space spanned by the different spectral regions at the display.

18 Claims, 6 Drawing Sheets

U.S. PATENT DOCUMENTS

| | | | | |
|---|---|---|---|---|
| 5,161,059 A | * | 11/1992 | Swanson et al. | 359/565 |
| 5,218,471 A | * | 6/1993 | Swanson et al. | 359/565 |
| 5,231,432 A | * | 7/1993 | Glenn | 353/31 |
| 5,264,880 A | * | 11/1993 | Spargue et al. | 353/31 |
| 5,272,551 A | * | 12/1993 | Lehureau et al. | 359/19 |
| 5,344,447 A | * | 9/1994 | Swanson | 623/6 |
| 5,442,480 A | * | 8/1995 | Swanson et al. | 359/355 |
| 5,615,024 A | * | 3/1997 | May et al. | 359/19 |
| 5,682,265 A | * | 10/1997 | Farn et al. | 359/571 |

FOREIGN PATENT DOCUMENTS

| | | | |
|---|---|---|---|
| JP | SHO 62-94826 | * | 5/1987 |
| JP | 62-150317 | * | 7/1987 |
| JP | 62-293223 | * | 12/1987 |
| JP | SHO 63-118125 | * | 5/1988 |
| JP | HEI 1-281426 | * | 11/1989 |
| JP | 2-296243 | * | 12/1990 |
| JP | 5-249318 | * | 9/1993 |
| WO | WO 95/22773 | * | 8/1985 |

OTHER PUBLICATIONS

M. W. Farn, et al., "Color Serparation by Use of Binary Optics", Optics Letters, vol. 18, No. 15, pp. 1–3, Aug. 1993.*

M. W. Farn, et al., "Color Seperation Gratings", NASA conf. on Binary Optics, Huntsville Alabama, Conf. 3227, pp. 409–421, Feb. 1993.*

Layet, B., et al., "Stripe color seperation with diffractive optics," Applied Optics, 38(35):1793–7201 (1991).

* cited by examiner

EFFICIENT ILLUMINATION SYSTEM FOR COLOR PROJECTION DISPLAYS

RELATED APPLICATION

This application is a continuation of application U.S. Ser. No. 08/330,339 filed on Oct. 27, 1994 now abandoned, the entire contents of which is incorporated by reference.

GOVERNMENT SUPPORT

The invention was supported, in whole or in part, by a grant F19628-85-C-0002 from Massachusetts Institute of Technology. The Government has certain rights in the invention.

BACKGROUND OF THE INVENTION

Currently used techniques for color projection displays tend to be relatively inefficient in their light utilization. Such low efficiency limits the brightness of the display, which in effect limits the acceptable amount of ambient lighting in a viewing environment.

In certain presently used designs, light from a spectrally broad source is colected by a condensing lens and illuminates a spatial light modulator system. The spatial light modulator system comprises a two-dimensional array of pixels and the amount of light transmitted through each pixel is controlled electronically. A projection lens then images the array of pixels on a viewing screen, the magnification of the displayed image being determined by the particular characteristics of the projection lens. The light impinging on each pixel of the spatial light modulator is spectrally relatively broad (e.g., white light). Therefore, unless the system is modified to distinguish colors, the display will be capable of only displaying black and white images.

In many current systems used to modify such a system so that it is capable of displaying color images, each pixel of the spatial light modulator is divided into three sub-pixels having equal areas. Each of the three sub-pixels is covered with a micro-color filter having a different spectral transmittance. For example, the filters are chosen such that one filter transmits only red light, another filter only green light, and the third filter only blue light. The transmittances of the three sub-pixels of each pixel of the spatial light modulator can be controlled independently, resulting in the ability to display a color image.

The inefficiency of the above approach can be seen by considering the following factors. The light illuminating a full pixel essentially is white light and, consequently, the light impinging each sub-pixel is also white light. The red filtered sub-pixel will transmit only red light, absorbing all of the incident green and blue light. Likewise, the other two sub-pixels will transmit only its corresponding color, absorbing the other two colors. It is apparent that this approach utilizes, at most, only one-third of the available light impinging on the modulator, and absorbs the rest.

Furthermore, state-of-the-art microcolor filters required to produce acceptable color images are only approximately 33% efficient in transmitting the color that they are designed to transmit. Therefore, the overall light utilization of current color projection displays is only about 10%.

One approach for improving the efficiency of color projection displays is found in U.S. Pat. No. 5,161,042 issued on Nov. 3, 1994 to H. Hamoda. In accordance therewith, the spectrally broad input light is supplied to three dichroic mirrors which reflect three different color components, e.g., red, green, and blue, in different directions, i.e., at different angles with respect to each other. The reflected components are then supplied to an array of lenses for focusing the different color components so as to converge light beams of similar wavelength ranges for transmission through a liquid crystal display element so as to form combined color images on a display screen. A further U.S. Pat. No. 5,264,880, issued on Nov. 23, 1993, to R. A. Sprague et al., discloses a similar approach to that of Hamoda wherein the dichroic mirrors are replaced by a blaze grating for dispersing the color components of light received thereat into a spectrum of different colors at different angles relative to each other.

It is believed that, while such approaches can be used, the losses of energy of each color component are sufficient reduce the efficiencies of such systems and to show the need for further improvement in display systems which would minimize such losses so as to provide nearly total use of the received energy across the color spectrum in the imaging display process, i.e., an optimization of the efficiency of the system.

BRIEF SUMMARY OF THE INVENTION

In accordance with a preferred embodiment of the invention which achieves such improved operation, received light having a relatively broad spectrum illuminates a multi-level optical phase grating so as to disperse each of the color components contained therein into a plurality of different diffraction orders. The diffraction orders of each color component are then focussed onto a zero-order phase shift element which phase shifts only the undiffracted light (i.e., the zero diffraction order) with respect to the diffracted light (i.e., the higher level diffraction orders). The output of the zero-order phase shifter is then imaged onto a display having a plurality of pixels, each pixel having sub-pixel regions assigned to transmit different color components of light. The depths of the phase grating element and the zero-order phase shifter are suitably selected so that they are practical for manufacture and so that the area of chromaticity space for the color components at the image plane is maximized.

The use of such a combination of multi-level phase grating and a zero-order phase shifter, having suitably determined depths, provides desired color components at each pixel in which essentially little or no energy is lost, which color components are then suitably combined to provide a color image at each of the pixels of the display which is considerably brighter than that available using prior known systems.

DESCRIPTION OF THE INVENTION

The invention can be described in more detail with the help of the accompanying drawings wherein FIGS. 1 and 2 show block diagrams of a system using the technique of the invention;

In order to increase the light utilization of color displays, the novel technique of the invention can be considered, in a conceptual sense, as effectively concentrating all of the light of each color component in a spectrally broad received light on to appropriate sub-pixel regions at a color image plane, e.g., all of the incident red light is concentrated in a manner such that it only illuminates the sub-pixel regions corresponding to the red component thereof, all of the incident green light is concentrated in a manner such that it only illuminates the sub-pixel regions corresponding to the green component thereof, and all of the incident blue light is concentrated in a manner such that it only illuminates the sub-pixel regions corresponding to the blue component thereof. By so doing, the use of micro-filters is not necessary, and the theoretical light utilization efficiency of such technique would approach 100%.

The proposed approach to achieving such concentrations is based on a concept referred to as aperture filling. Aperture filling is described, for example, in the article, "Aperture filling of phase-locked laser arrays" by G. J. Swanson et al., *Optics Letters,* Vol. 12, April 1987. Such article, for example, describes a method in another context for increasing the energy in the central lobe of a far-field pattern of a phased-locked laser array. In accordance with the invention, the underlying physics of such technique is modified and extended in a unique manner in order to solve the color display problem of maximizing the light utilization therein.

The basic physics behind aperture filling can be stated as follows: A binary amplitude grating (i.e., one having a transmittance of 1 or 0) with a fill factor (i.e., the ratio of the transmitting area to the total area) of greater than or equal to 0.25, has, aside from a phase shift of the zero order, a Fourier transform identical to that of a binary phase grating having the same fill-factor as the amplitude grating.

Such statement implies that by placing a zero-order phase shift element in the transform plane of an afocal imaging system, the light from an aperture with a fill-factor factor of $\geq 0.25$, can be uniformly spread out to fill the entire aperture. Further, by invoking reciprocity, light from a uniform aperture can be concentrated to produce an underfilled aperture with a fill-factor of $\geq 0.25$.

Figure 1:
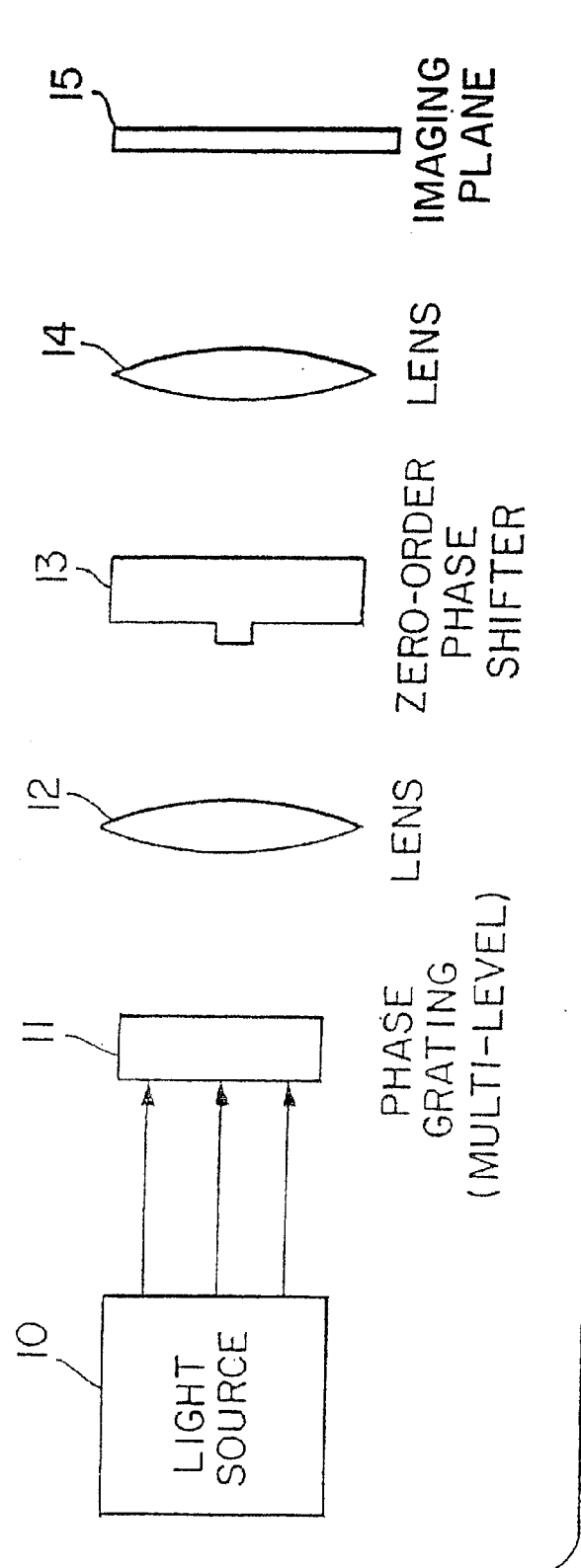
Figure 2:
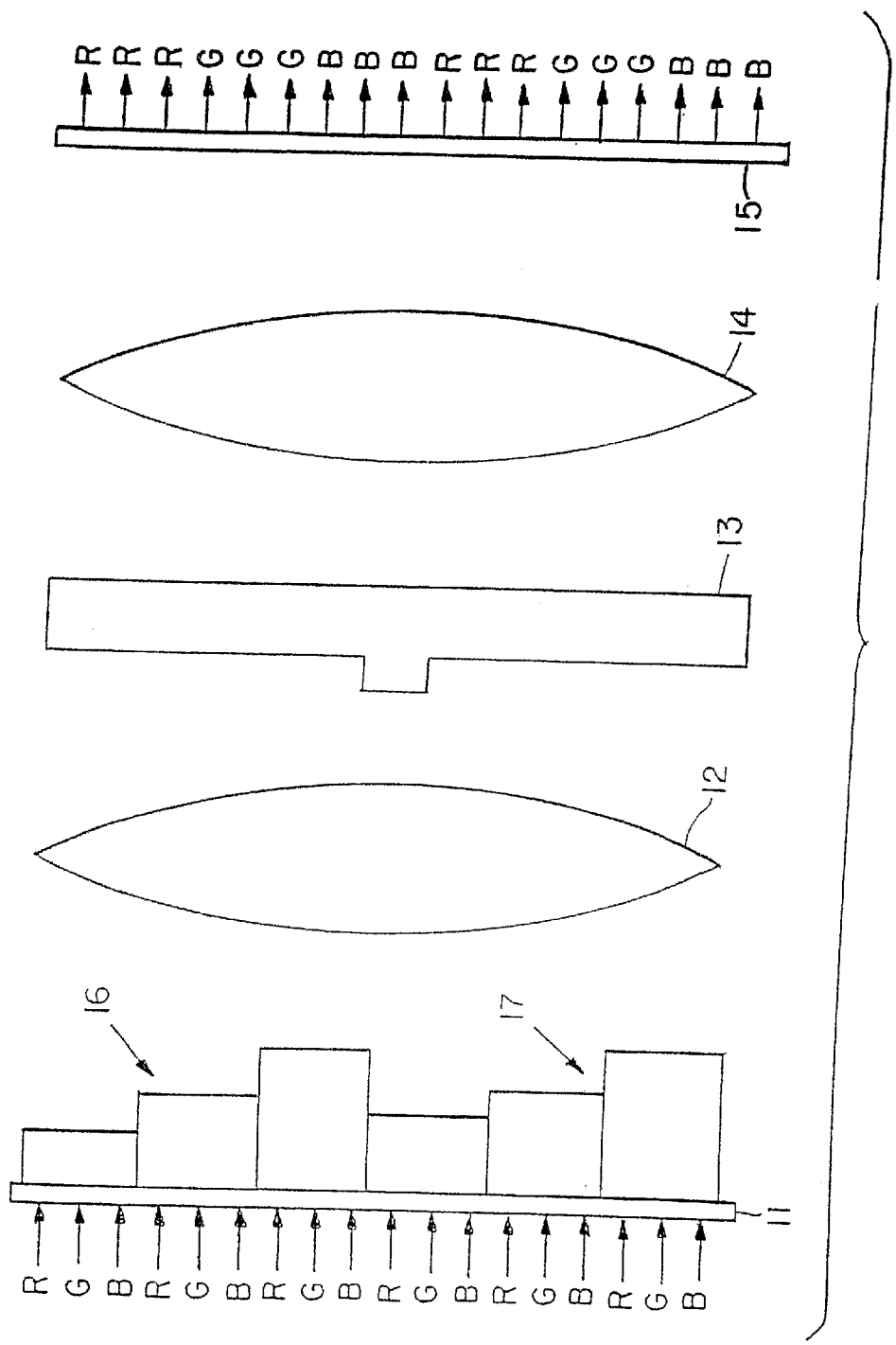

In making use of such concepts for improving the color projection display efficiency, the above phenomenon can be modified to substantially improve the light throughput thereof. A system embodying the technique in accordance with the invention is shown in FIGS. 1 and 2, wherein a multi-level, e.g., a three-level, phase grating is illuminated with a spectrally broad light from a source 10, such as a tungsten halogen bulb or a xenon arc lamp. Alternatively, the light source may comprise three separate color component sources. For example, three light emitting diodes (LEDs) or three laser sources, each emitting a separate color such as red, green, and blue color components. For the purposes of the particular description of a preferred embodiment of the invention, it is assumed that the illuminating source, whether a single broad spectrum source or separate color sources, primarily includes color components of the three wavelength regions, e.g., red, green, and blue. The lateral dimension of each phase level is assumed to be equal to the lateral dimension of a sub-pixel region of the spatial light modulator. For illustrative purposes only, FIG. 2 shows only two greatly magnified grating periods, each having corresponding three phase depth levels, occupying the entire aperture. It should be understood that a large plurality of grating periods, each corresponding to a pixel of the overall color image, would normally occupy an aperture.

If it is assumed that a first phase depth level measured with respect to a second phase depth level at each grating period of the phase grating 11 is equal to an integral number of wavelengths of red light plus one-third of such wavelength, i.e., (m+0.33) where m is an integer, and the third phase depth level, again measured with respect to the second phase depth level, is an integer multiple of the wavelength of red light, the red light that is illuminating a three-level phase grating will in effect encounter a binary phase grating with a fill-factor of 33%, and a phase depth of 0.33 wavelengths. The red light will be dispersed from the phase grating 11 into a zero diffraction order and a plurality higher level positive and negative diffraction orders which are focussed on a zero-order phase shifter 13 via lens 12. If the zero diffraction order (undiffracted) is then effective by shifted by about 0.33 wavelengths of red light by phase shifter 13, the red light exiting the system will be concentrated via a lens 14 so as to fill only 33% of the output imaging plane 15 (FIG. 2).

The same methodology as applied above to the red light range can also be applied to the green and blue light ranges. The second phase depth level at each grating period equals zero wavelengths of green light by definition, and the first and third phase depth levels equal (n−0.33) and n'−0.33) wavelengths of green light, respectively, where n and n' are integers. The green light illuminating the phase grating 11 will also effectively encounter a binary phase grating with a fill-factor of 33%, and a phase depth of 0.33 wavelengths. If the zero diffraction order is also effectively shifted by about 0.33 wavelengths, the green light exiting the system will be concentrated so as to fill the 33% of the output imaging plane that is adjacent to the 33% of the output plane occupied by the red light (FIG. 2).

For the blue light, the third phase depth level of each grating period, again measured with respect to the second phase depth level, equals (p'+0.33) wavelengths of blue light (where p' is an integer), and the first phase depth level is an integer multiple of wavelengths of blue light. The blue light illuminating the grating will also in effect encounter a binary phase grating with a fill-factor of 33%, and a phase depth of 0.33 wavelengths of blue light. If the zero diffraction order is also effectively shifted by about 0.33 wavelengths, the blue light exiting the system will be concentrated so as to fill the remaining 33% of the imaging plane not occupied by the red light and the green light (FIG. 2).

The above conditions for three discrete color wavelengths can in theory be met to any level of accuracy. However, in practice, the accuracy is limited by the physical depths of the grating levels that can be practically manufactured. Furthermore, the system can be designed to operate over the entire visible spectrum, rather than at only three discrete wavelength regions.

The area of chromaticity space spanned by a particular embodiment of the invention will depend on the relative depths of the three phase level regions of each grating period corresponding to each pixel, and the depth of the zero-order phase shifter. Since the phase depths are relative, and measured with respect to the second phase depth level, the second phase depth level is zero by definition, this leaving three variables, the depths of phase levels 1 and 3 with respect to phase level 2, and the depth of the zero order phase shifter. These three parameters in effect define the performance of the overall system, with the measure of performance being defined as the area of chromaticity space that is so covered. These three depth parameters are most easily optimized by performing a "global search" process that spans the range of practicable manufacturable depths. The goal thereof is to select relative depths which will maximize the area and the location of the spanned chromaticity space. An approach to such process is discussed below.

In considering the first phase level of the grating period, the phase shifts (in waves) $\phi^1_R$, $\phi^1_G$, and $\phi^1_B$ of the red, green, and blue light can be expressed as:

$$\phi^1_R = \frac{d_1}{\lambda_R}(\eta - 1)$$

$$\phi^1_G = \frac{d_1}{\lambda_G}(\eta - 1)$$

$$\phi^1_B = \frac{d_1}{\lambda_B}(\eta - 1)$$

where $\eta$ is the index of refraction of the phase grating, and $d_1$ is the depth of the first phase level with respect to the second phase level. As mentioned above, it is desired that the phase shift $\phi^1_R$=m+0.33, while the phase shift $\phi^1_G$=n−0.33, and the phase shift $\phi^1_B$=p, where m, n, and p are all integers.

In a similar manner at the third phase level, having a depth of $d_3$ with respect to the second phase level, the phase shifts are:

$$\phi^3_R = \frac{d_3}{\lambda_R}(\eta - 1)$$

$$\phi^3_G = \frac{d_3}{\lambda_G}(\eta - 1)$$

$$\phi^3_B = \frac{d_3}{\lambda_B}(\eta - 1)$$

Here, it is desired that the phase shift $\phi^3_R$=m', the phase shift $\phi^3_G$=n'−0.33, and the phase shift $\phi^3_B$=p'+0.33, where m', n', and p' are all integers.

Since the first and third phase levels of the grating are referenced in depth to the second phase level of the grating, by definition, $d_2$=0, and at the second phase level the phase shifts at all three wavelengths is zero:

$$\phi^2_R = 0$$

$$\phi^2_G = 0$$

$$\phi^2_B = 0$$

In addition, at the zero-order phase shifter having a depth of $d_4$, a phase shift of about one-third wavelength of each color is required so that at the phase shifter:

$$\phi^4_R = \frac{d_4}{\lambda_R}(\eta - 1)$$

$$\phi^4_G = \frac{d_4}{\lambda_G}(\eta - 1)$$

$$\phi^4_B = \frac{d_4}{\lambda_B}(\eta - 1)$$

where $\phi^4_R$=r+0.33, $\phi^4_G$=s+0.33 and $\phi^4_B$=t+0.33 (where r, s, and t are integers).

Since the depths of $d_1$, $d_2$, $d_3$, and $d_4$ must be within practical manufacturable limits, the following practical limitations can be imposed thereon:

−5 μm ≤ $d_1$ ≤ +5 μm

−5 μm ≤ $d_3$ ≤ +5 μm

−5 μm ≤ $d_4$ ≤ +5 μm and the value of $\eta$ can be assumed at a conventional value, for example, of 1.5.

Using the above equations, those in the art can then utilize a well known global search algorithm technique, in which the values of the depths $d_1$, $d_3$, and $d_4$ are changed in steps, Δd, of approximately 0.01 μm, and used to determine in each case the area of the chromaticity space that can be spanned for each set of parameters. The depths $d_1$, $d_3$, and $d_4$ for the solution providing a maximized area can then be used as the practical physical depths for the three phase level regions at each phase grating period and the practical physical depth of the zero-order phase shifter.

In accordance with a specific embodiment of the invention, such a process was used to determine the three optimum depth parameters for a system operating with a uniform spectral source covering a 0.40–0.68 μm wavelength region, using both multi-level phase grating and zero-order phase shift substrates assumed to have an index of refraction of 1.5.

Figure 3:
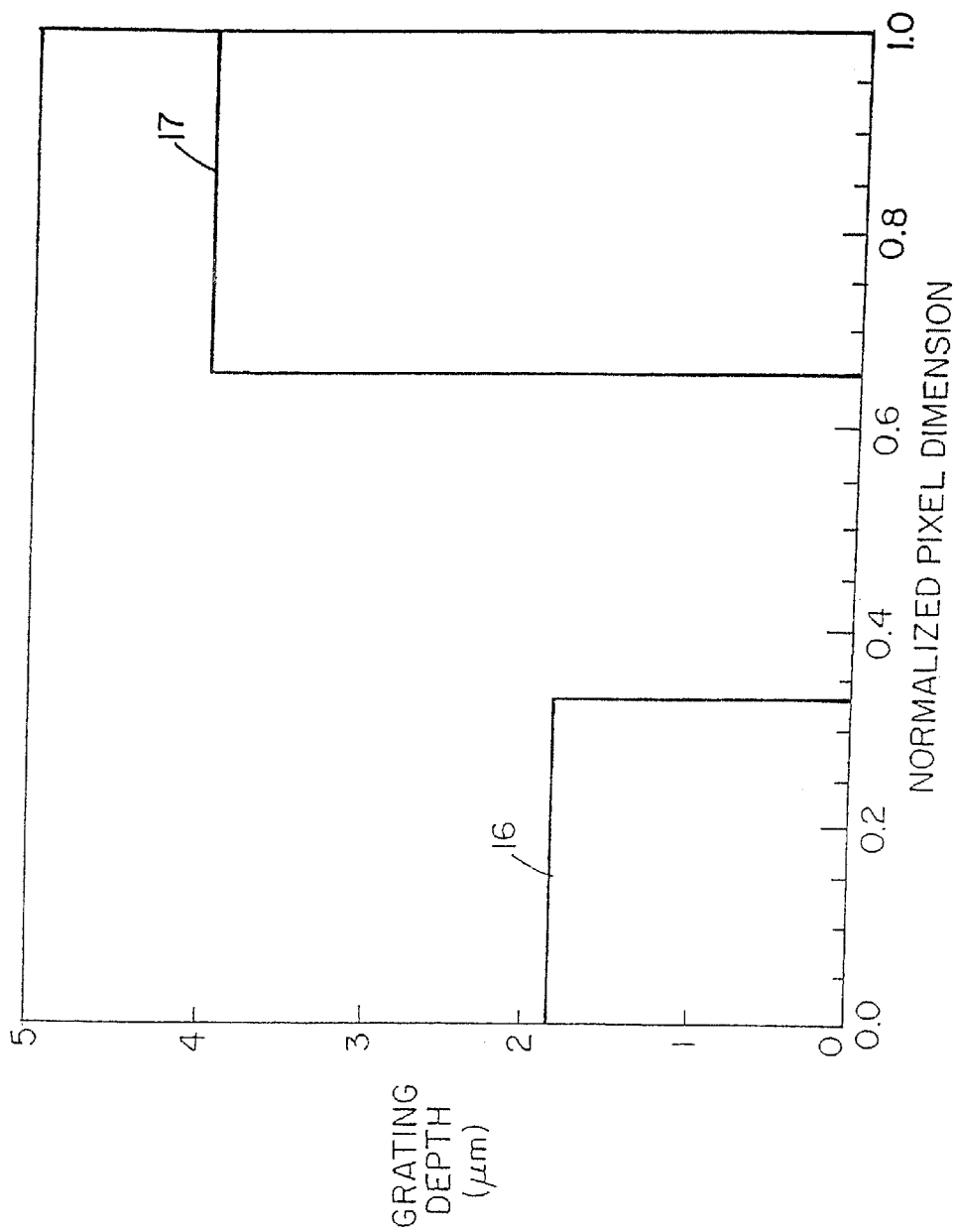
FIG. 3 shows a graph of optimized phase grating depths of three phase levels for a normalized pixel dimension for red, green and blue color channels.

Exemplary results for optimized sub-pixel phase grating depths of an exemplary pixel having a normalized pixel dimension are shown in FIG. 3, with the red channel having a phase grating depth 16 of 1.84 μm relative to the green channel, and the blue channel having a phase grating depth 17 of 4.0 μm relative to the green channel.

Figure 4:
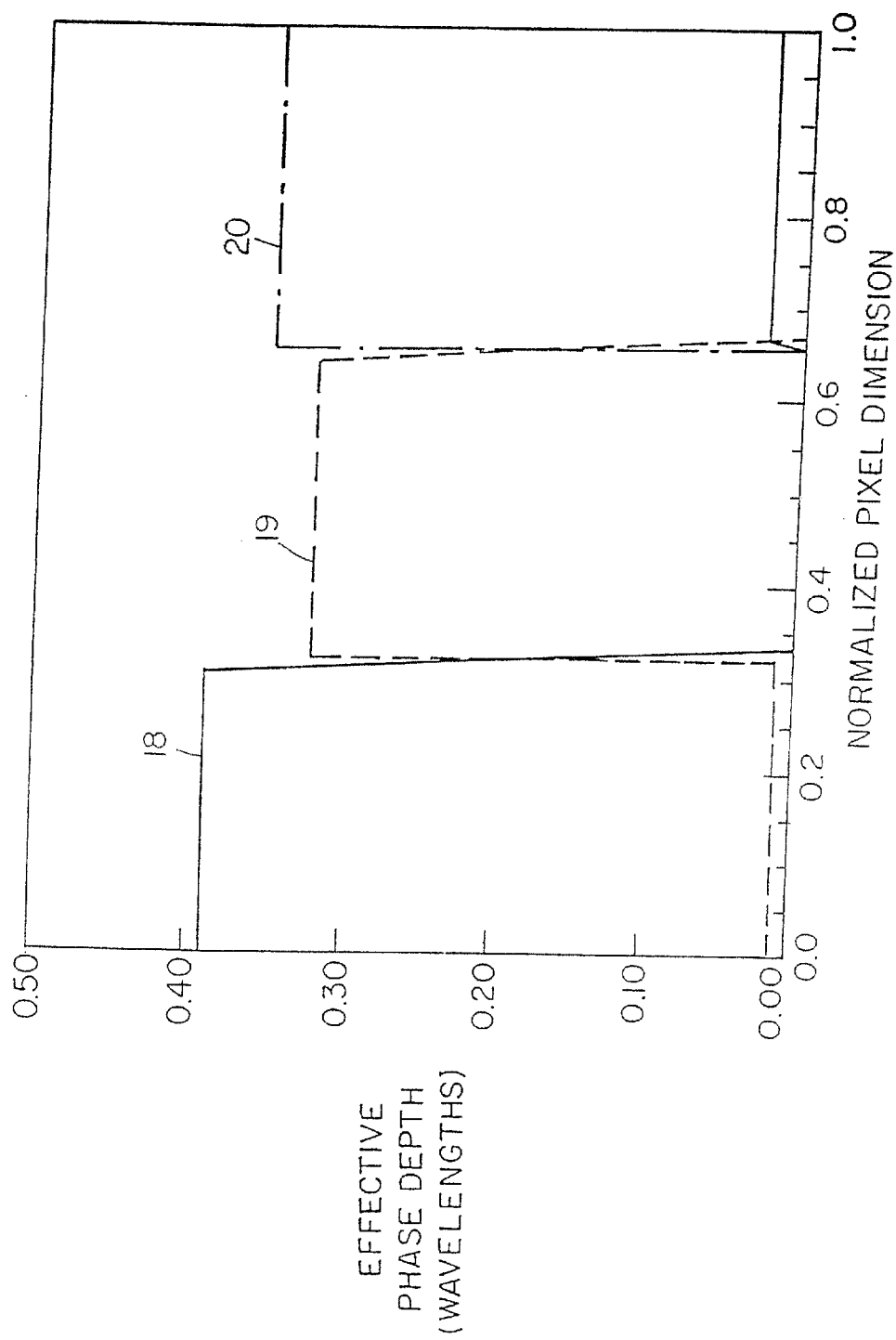
FIG. 4 shows the effective phase grating depths of three phase levels for a normalized pixel dimension for the wavelengths of the red, green and blue color components.

In order to illustrate how such an optimized phase grating design conforms to the theory described above, the following three discrete wavelengths can be considered: red=0.66 μm, green=0.54 μm, and blue=0.46 μm. The effective phase grating depths (modulo one-wave) of the three sub-pixels at these three phase level regions are shown in FIG. 4, where the solid line 18 represents red, the dashed line 19 represents green, and the dot-dash line 20 represents blue. It should be noted that in the first sub-pixel region, the phase grating depth for red approximates one-third wavelength of red light, and the phase grating depths for green and blue are essentially zero. Similarly, in the second sub-pixel region, the effective phase grating depth for the green approximates one-third wavelength of green light, and the phase grating depths for red and blue are approximately zero. In the third sub-pixel region, the effective phase grating depth for blue approximates one-third wavelength of blue light, while the phase grating depths for red and green are approximately zero.

The optimized depth for the zero-order phase shifter is 0.36 μm, which depth corresponds to 0.27 wavelengths of red, 0.33 wavelengths of green, and 0.39 wavelengths of blue. For this example, it is noted that the optimum phase depth is less than one wave for all three wavelengths.

Figure 5:
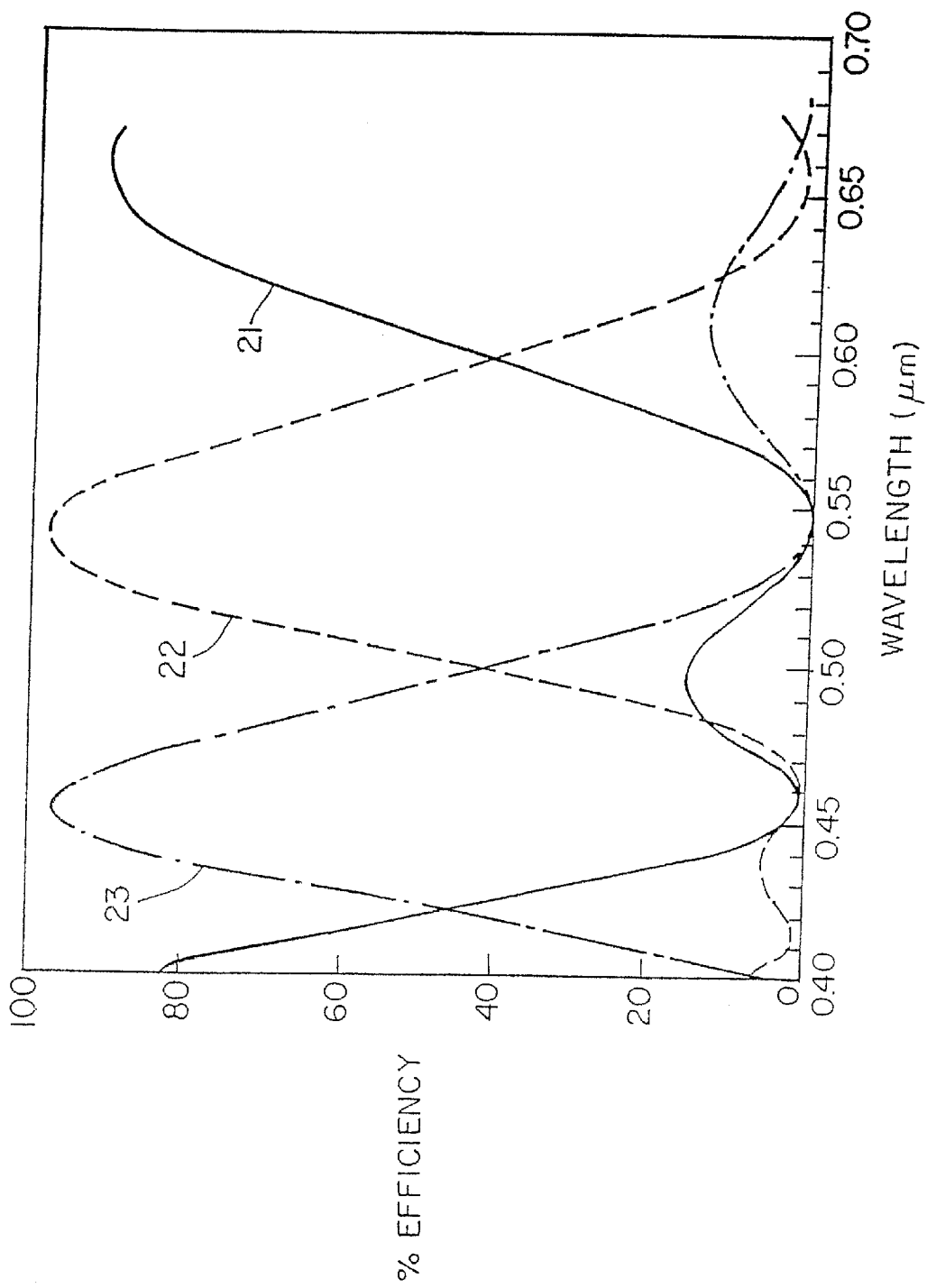
FIG. 5 shows the percent efficiencies of the spectral content for the red, green and blue color components.

The system's ability to concentrate the visible spectrum into three color channels is illustrated in FIG. 5 for the above-mentioned 0.4–0.68 μm wavelength region. The solid curve 21 represents the % efficiency of the spectral content of the red channel, the dashed curve 22 represents the % efficiency of the spectral content of the green channel, and the dash-dot curve 23 represents the % efficiency of the spectral content of the blue channel. It should be noted that the red channel efficiency peaks at a wavelength of 0.66 μm, the green channel efficiency peaks at 0.54 μm, and the blue channel efficiency peaks at 0.46 μm. The red channel has a secondary peak in the far blue region of the spectrum. This blue light, in effect "leaking" into the red channel, tends to limit the area covered in chromaticity space. In some cases, it may be desired or required to remove this unwanted blue light from the red channel by conventionally filtering the red channel and such removal can be achieved with a blue-blocking micro-filter, albeit at the cost of losing a minimal amount of the blue light energy.

Figure 6:
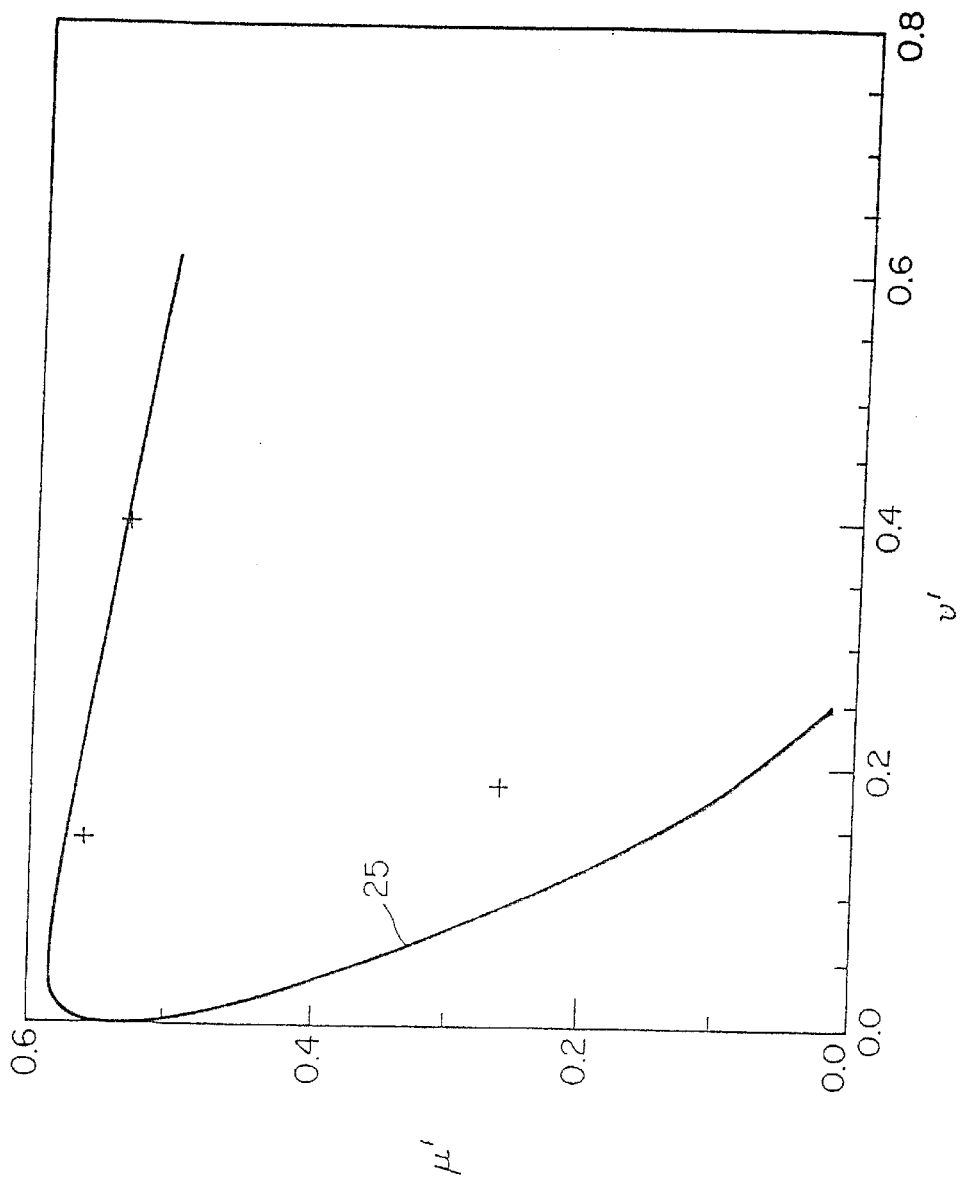
FIG. 6 shows the area of the chromaticity space covered when using a particular embodiment of the invention on a standard 1976 CIE chromaticity graph space.

As is well known to the art, the spectral content of these three color channels can then be used to determine the area of chromaticity space spanned by the system. FIG. 6 shows a standard 1976 CIE chromaticity space graph 25 which is well known to the art. This area of the chromatocity space spanned by the embodiment discussed above is depicted by three vertices of a triangle, defined by the plus signs, in the graph. This area will be covered using essentially 100% of the received source illumination.

Whiled the above description discusses a preferred embodiment of the technique of the invention, modification thereto may occur to those in the art within the spirit and scope of the invention. Hence, the invention is not to be construed as limited thereto, except as defined by the appended claims.

What is claimed is:

1. A method for displaying a color image comprising:
   illuminating a multi-level optical phase element with light having a spectrum that includes at least three primary color components to disperse each of the primary color components of said light into a plurality of diffraction orders, the optical phase element having a separate level for each of the primary colors;
   focusing the diffraction orders from the multi-level optical phase element with a lens onto a phase shift element which phase shifts undiffracted light with respect to diffracted light; and
   imaging the plane of the multi-level optical phase element onto a pixellated liquid crystal display having a plurality of pixels such that selected pixels transmit different spectral regions.

2. A method in accordance with claim 1, concentrating different spectral regions of the light which illuminates said multi-level optical phase element at different subpixel regions of each pixel at the display; and further including
   maximizing the area of chromaticity space for the different spectral regions spanned at the display.

3. A method in accordance with claim 2, wherein said multi-level optical phase element includes a plurality of multi-level optical phase element periods each having a plurality of optical phase sub-elements of different selected depths and said phase shift element has a zero-order phase element having a selected depth and said maximizing includes
   selecting the depths of the optical phase sub-elements at each of the multi-level optical phase element periods of the multi-level optical phase element and the depth of said zero-order phase element of said phase shift element so that the selected values thereof produce a maximizing of the area of chromaticity space.

4. A method in accordance with claims 3, wherein the depths of said optical phase sub-elements and said zero-order phase element are selected to lie within a range thereof which will permit the practical manufacture of said multi-level optical phase element and said phase shift element.

5. A method in accordance with claim 3, wherein the depths of the optical phase sub-elements at each of the multi-level optical phase element periods of said multilevel optical phase element are selected to approximate a selected fraction of the wavelengths of different spectral regions of the light.

6. A method in accordance with claim 1, wherein different spectral regions are red, green and blue regions of the spectrum and said imaging includes concentrating said red, green and blue spectral regions at different adjacent sub-pixel regions of each pixel at the display.

7. A method in accordance with claim 6, wherein said red, green and blue regions are concentrated at sub-pixel regions each of which occupies one-third of the corresponding overall pixel region.

8. A system for displaying a color image comprising:
   a source of light having a spectrum including a plurality of primary color components;
   a multi-level optical phase element illuminated by light from said source for dispersing each of the primary color components of said light into a plurality of diffraction orders, the optical element having at least three separate levels to separate the primary colors;
   a phase shifter responsive to said dispersed light from said multi-level optical phase element for shifting undiffracted light thereof with respect to diffracted light thereof;
   a first lens between the multi-level optical phase element and the phase shifter, the lens focusing light onto the phase shifter; and
   a liquid crystal display that provides an image of the light from said source at an imaging plane having a plurality of pixels such that different spectral regions of the light from said source at the plane of said multi-level optical phase element are concentrated at said imaging plane so as to be imaged at different sub-pixel regions of each of said pixels at said imaging plane.

9. A system in accordance with claim 8, said system further including a second lens that receives light from the phase shifter to provide the image at said imaging plane.

10. A system in accordance with claim 8 or 9 wherein said multi-level optical phase element periods corresponding to a plurality of pixels at said imaging plane, each multi-level optical phase element period having a plurality of optical phase sub-elements with selected depths for different spectral regions of the received light and said phase shifter has a zero-order phase shift element of a selected depth, the depths of said optical phase sub-elements and said zero-order phase shift element being selected to maximize the area of chromaticity space spanned at the imaging plane.

11. A system in accordance with claim 10, wherein the depths of said optical phase sub-elements are selected to be selected fractions of the wavelengths of the spectral regions of the received light.

12. A system in accordance with claim 11, wherein optical phase sub-elements of the multi-level optical phase element corresponding to red, green and blue light regions of the spectrum have depths which are selected fractions of the wavelengths of said red, green and blue light regions.

13. A system in accordance with claim 8, wherein said source of light is a single source thereof.

14. A system in accordance with claim 13, wherein said single source is a tungsten halogen bulb.

15. The system of claim 13 wherein the single source comprises a xenon arc lamp.

16. A system in accordance with claim 8, wherein said source of light comprises three sources of red light, green light, and blue light, respectively.

17. A system in accordance with claim 16, wherein said three sources are light emiting diodes.

18. The system of claim 16 wherein the three sources comprise laser sources.

* * * * *